(12) United States Patent
Chai et al.

(10) Patent No.: US 12,230,509 B2
(45) Date of Patent: Feb. 18, 2025

(54) METHOD FOR FABRICATING SEMICONDUCTOR DEVICE

(71) Applicant: UNITED MICROELECTRONICS CORP., Hsin-Chu (TW)

(72) Inventors: Ming Thai Chai, Singapore (SG); Meng Xie, Singapore (SG); Wenbo Ding, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 1054 days.

(21) Appl. No.: 17/029,021

(22) Filed: Sep. 22, 2020

(65) Prior Publication Data
US 2022/0068651 A1 Mar. 3, 2022

(30) Foreign Application Priority Data
Aug. 27, 2020 (CN) .......................... 202010876084.0

(51) Int. Cl.
*H01L 21/324* (2006.01)
*H01L 21/02* (2006.01)
*H01L 21/285* (2006.01)
*H01L 21/762* (2006.01)
*H01L 29/40* (2006.01)
*H01L 29/66* (2006.01)
*H01L 29/78* (2006.01)

(52) U.S. Cl.
CPC ...... *H01L 21/324* (2013.01); *H01L 21/02057* (2013.01); *H01L 21/02068* (2013.01); *H01L 21/28518* (2013.01); *H01L 21/7624* (2013.01); *H01L 29/401* (2013.01); *H01L 29/665* (2013.01); *H01L 29/66568* (2013.01); *H01L 29/78* (2013.01); *H01L 29/66545* (2013.01); *H01L 29/66606* (2013.01)

(58) Field of Classification Search
CPC ........................... H01L 21/324; H01L 29/401
See application file for complete search history.

(56) References Cited

U.S. PATENT DOCUMENTS

| 8,741,739 B2 | 6/2014 | Botula et al. | |
|---|---|---|---|
| 2002/0019127 A1* | 2/2002 | Givens | H01L 21/76855 |
| | | | 438/618 |
| 2009/0004426 A1* | 1/2009 | Falster | H01L 21/3225 |
| | | | 257/E21.321 |
| 2009/0087983 A1* | 4/2009 | Lee | H01L 21/76877 |
| | | | 438/655 |
| 2009/0191684 A1* | 7/2009 | Shue | H01L 29/7833 |
| | | | 257/E21.409 |
| 2021/0217849 A1* | 7/2021 | Jain | H01L 27/1203 |
| 2021/0391184 A1* | 12/2021 | Huang | H01L 29/0847 |

* cited by examiner

*Primary Examiner* — Aaron J Gray
(74) *Attorney, Agent, or Firm* — Winston Hsu

(57) ABSTRACT

A method for fabricating a semiconductor device includes the steps of: forming a gate structure on a substrate; forming a source/drain region adjacent to the gate structure; performing a first cleaning process; performing a first rapid thermal anneal (RTA) process to remove oxygen cluster in the substrate; forming a metal layer on the source/drain region; and performing a second RTA process to transform the metal layer into a silicide layer.

7 Claims, 5 Drawing Sheets

METHOD FOR FABRICATING SEMICONDUCTOR DEVICE

BACKGROUND OF THE INVENTION

1. Field of the Invention

The invention relates to a method for fabricating semiconductor device, and more particularly, to a method of conducting rapid thermal anneal (RTA) process before silicide formation for preventing high resistance in radio frequency silicon-on-insulator (RFSOI) device.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

However, in current fabrication of high-k metal transistor, issues such as device mismatch often arise when two transistors on either NMOS and/or PMOS regions are disposed adjacent to each other and affect the performance of the device. Hence, how to resolve this issue has become an important task in this field.

SUMMARY OF THE INVENTION

According to an embodiment of the present invention, a method for fabricating a semiconductor device includes the steps of: forming a gate structure on a substrate; forming a source/drain region adjacent to the gate structure; performing a first cleaning process; performing a first rapid thermal anneal (RTA) process to remove oxygen cluster in the substrate; forming a metal layer on the source/drain region; and performing a second RTA process to transform the metal layer into a silicide layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
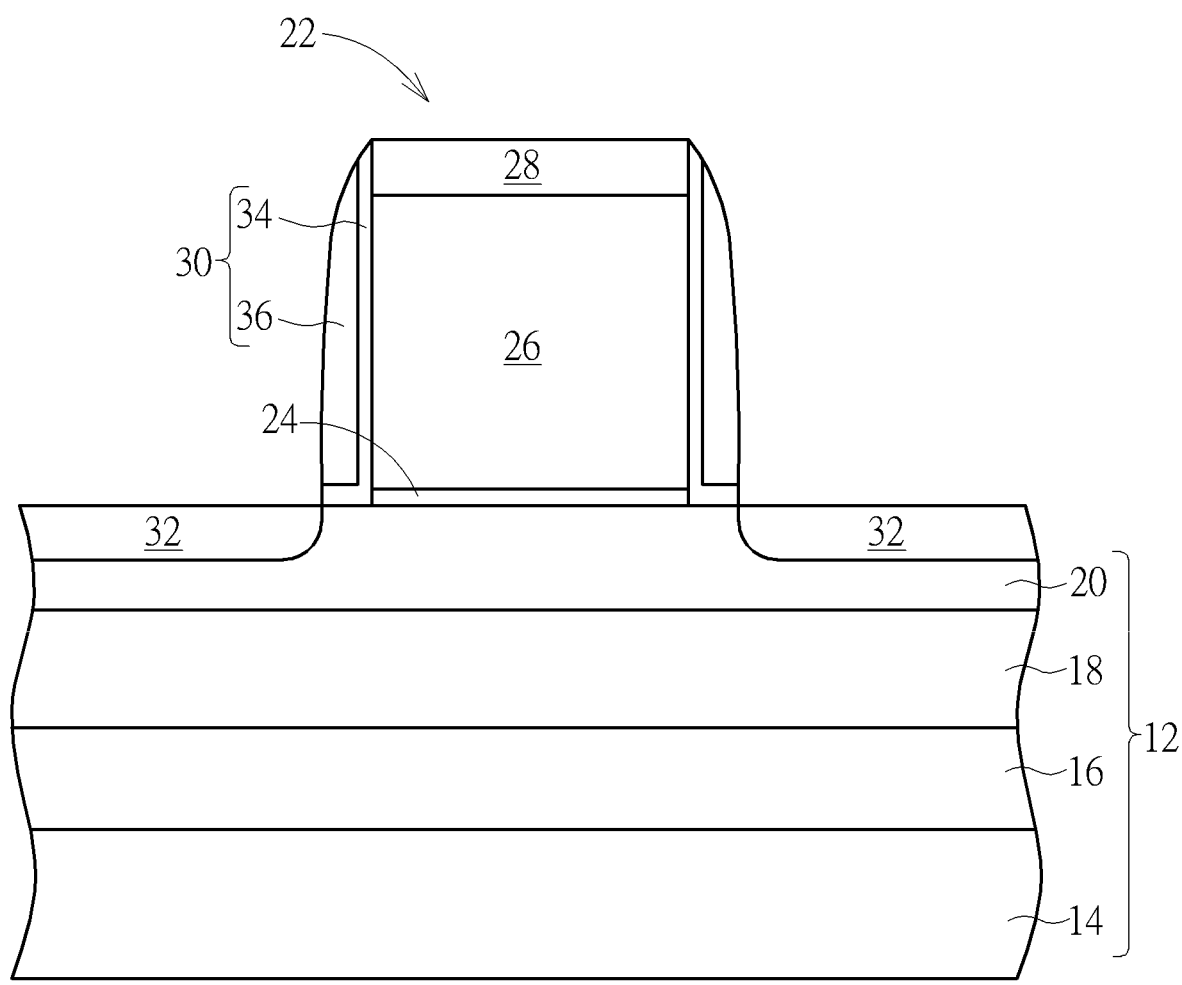
FIGS. 1-5 illustrate a method for fabricating semiconductor device according to an embodiment of the present invention.

Referring to FIGS. 1-5, FIGS. 1-5 illustrate a method for fabricating semiconductor device according to an embodiment of the present invention. As shown in FIG. 1, a substrate 12 is first provided, in which the substrate could be a silicon substrate or silicon-on-insulator (SOI) substrate. A transistor region, such as a PMOS region or a NMOS region could be defined on the substrate 12. In this embodiment, the substrate 12 preferably includes a SOI substrate including a lower level substrate 14 made of silicon handle wafer, a trap rich layer 16, an insulating layer 18, and an upper level substrate 20 also made of silicon. Preferably, the trap rich layer 16 includes polysilicon and the insulating layer 18 includes silicon oxide. The thickness of the lower level substrate 14 is approximately 775 microns, the thickness of the trap rich layer 16 is approximately 1.8 microns, the thickness of the insulating layer 18 is approximately 2000 Angstroms, and the thickness of the upper level substrate 20 is approximately 550 Angstroms.

Next, at least a gate structures 22 or dummy gate is formed on the substrate 12. In this embodiment, the formation of the gate structure 22 could be accomplished by a gate first process, a high-k first approach from gate last process, or a high-k last approach from gate last process. Since this embodiment pertains to a high-k last approach, a gate dielectric layer 24 or interfacial layer, a gate material layer 26 made of polysilicon, and a selective hard mask 28 could be formed sequentially on the substrate 12, and a pattern transfer process is then conducted by using a patterned resist (not shown) as mask to remove part of the hard mask 28, part of the gate material layer 26, and part of the gate dielectric layer 24 through single or multiple etching processes. After stripping the patterned resist, a gate structure 22 composed of patterned gate dielectric layer 24, a patterned material layer 26, and a patterned hard mask 28 are formed on the substrate 12.

Next, at least a spacer 30 is formed on the sidewalls of the gate structure 22 and source/drain regions 32 and/or epitaxial layers (not shown) are formed in the substrate 12 adjacent to two sides of the spacer 30. In this embodiment, the spacer 30 could be a single spacer or a composite spacer, such as a spacer including but not limited to for example an offset spacer 34 and a main spacer 36. Preferably, the offset spacer 34 and the main spacer 36 could include same material or different material while both the offset spacer 34 and the main spacer 36 could be made of material including but not limited to for example $SiO_2$, SiN, SiON, SiCN, or combination thereof. The source/drain regions 32 could include n-type dopants or p-type dopants depending on the type of device being fabricated. Next, a first cleaning process is conducted by using diluted hydrofluoric acid (dHF) to remove impurities from the surface of the substrate 12. In this embodiment, the duration of the first cleaning process is preferably less than 10 seconds or most preferably at around 5 seconds.

Figure 2:
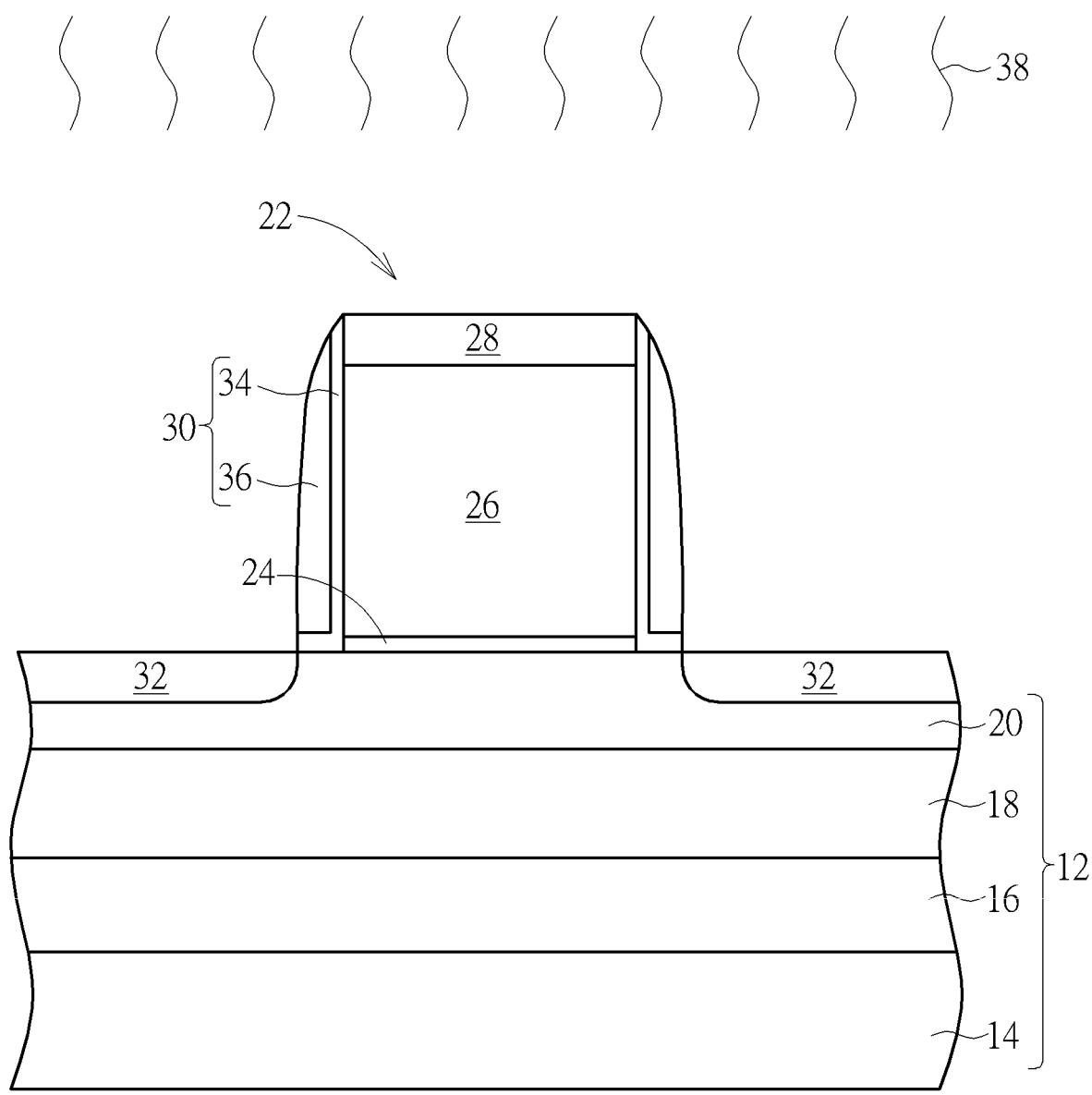

Next, as shown in FIG. 2, a first rapid thermal anneal (RTA) process 38 is conducted to remove oxygen clusters in the substrate 12 for removing overall resistance of the device. Typically, oxygen clusters could be generated in the trap rich layer 16 of the substrate 12 during various stages of low temperature treatment processes between 350° C. to 500° C. before the formation of silicide layer or more specifically before the formation of metal layer used for forming silicides and the accumulation of these oxygen clusters ultimately increases overall resistance of the device and affects the performance of the device substantially. To resolve this issue the present invention preferably conducts a first RTA process 38 after forming the source/drain regions 32 and before forming silicide layer to prevent oxygen clusters from accumulating in the trap rich layer 16. In this embodiment, the temperature of the first RTA process 38 is between 560° C. to 700° C.

It should be noted that it would be desirable to conduct one or more than one RTA process before or after forming the source/drain regions 32 and/or lightly doped drains (LDDs) (not shown) to activate dopants used for forming the lightly doped drains and/or source/drain regions 32. For instance, it would be desirable to first conduct an ion implantation process to implant dopants into the substrate 12 adjacent to two sides of the gate structure 22 accompanied by a RTA process to form lightly doped drains, form the spacer 30, conduct another ion implantation process to implant dopants into the substrate 12 adjacent to two sides of the spacer 30 accompanied by another RTA process for forming the source/drain regions 32, and then conduct the first RTA process 38 to remove oxygen clusters in the substrate 12.

In other word, it would be desirable to conduct at least two RTA processes for forming lightly doped drains and/or source/drain regions 32 respectively before carrying out the first RTA process 38. In this embodiment, the temperature of the two RTA processes conducted for forming the lightly doped drains and/or source/drain regions 32 is preferably higher than the temperature of the first RTA process 38. For instance, the temperature of the two RTA process used for forming the lightly doped drains and/or source/drain regions 32 is between 900° C. to 1100° C.

Figure 3:
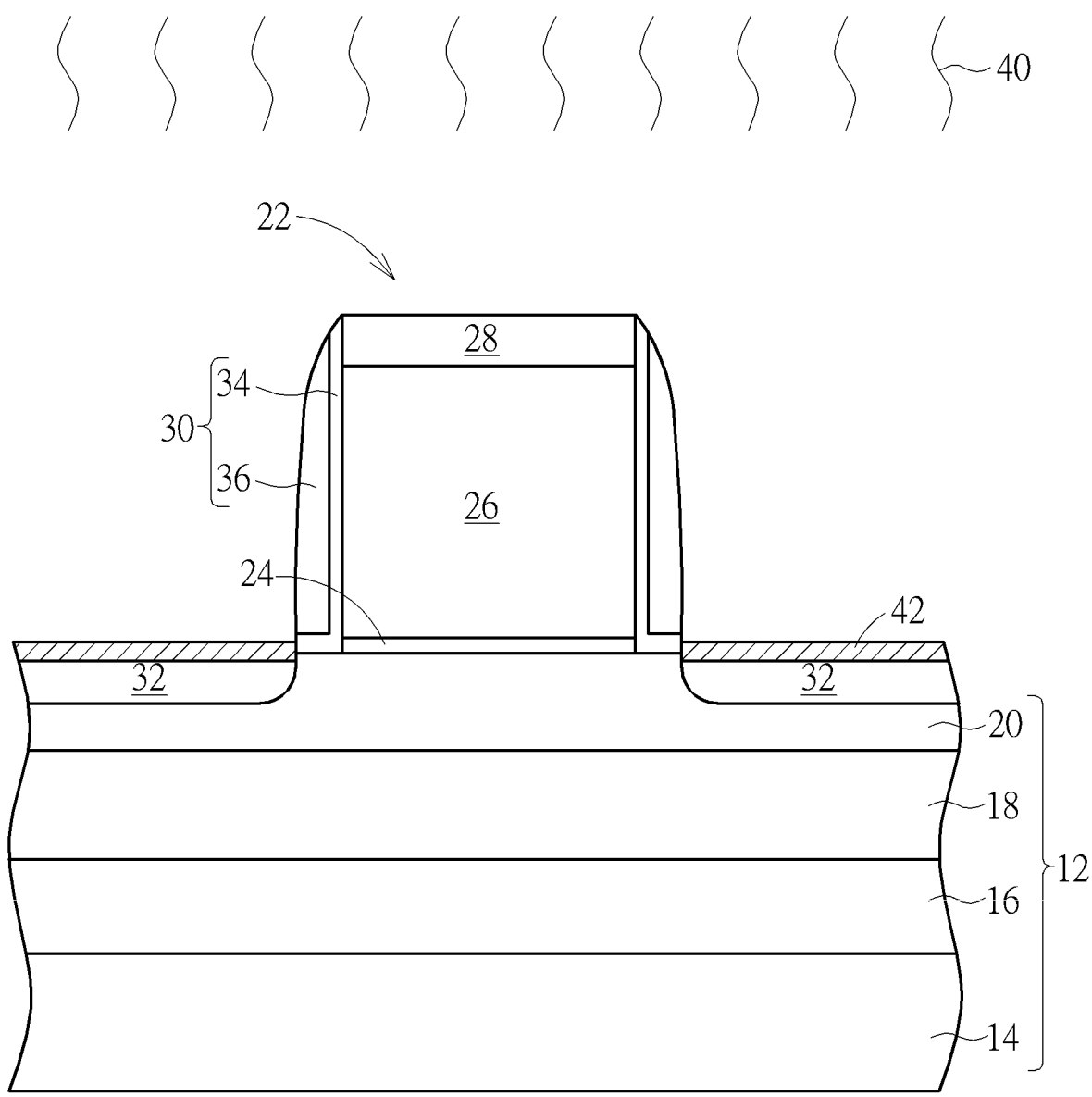

Next, as shown in FIG. 3, a second cleaning process is conducted to remove or more specifically completely remove impurities or remaining particles on the surface of the substrate 12. In this embodiment, the etchant used in the second cleaning process preferably includes ammonia ($NH_3$) and/or nitrogen trifluoride ($NF_3$). Next, a metal layer (not shown) is deposited or sputtered on the substrate 12 and the gate structure 22, in which the metal layer preferably includes nickel-platinum alloy. Nevertheless, according to other embodiment of the present invention the metal layer could also include cobalt, titanium, nickel, platinum, palladium, molybdenum, or alloy thereof. Next, a second RTA process 40 is conducted to react the metal layer with the substrate 12 for forming silicide layers 42 and un-reacted metal layer is removed thereafter.

Figure 4:
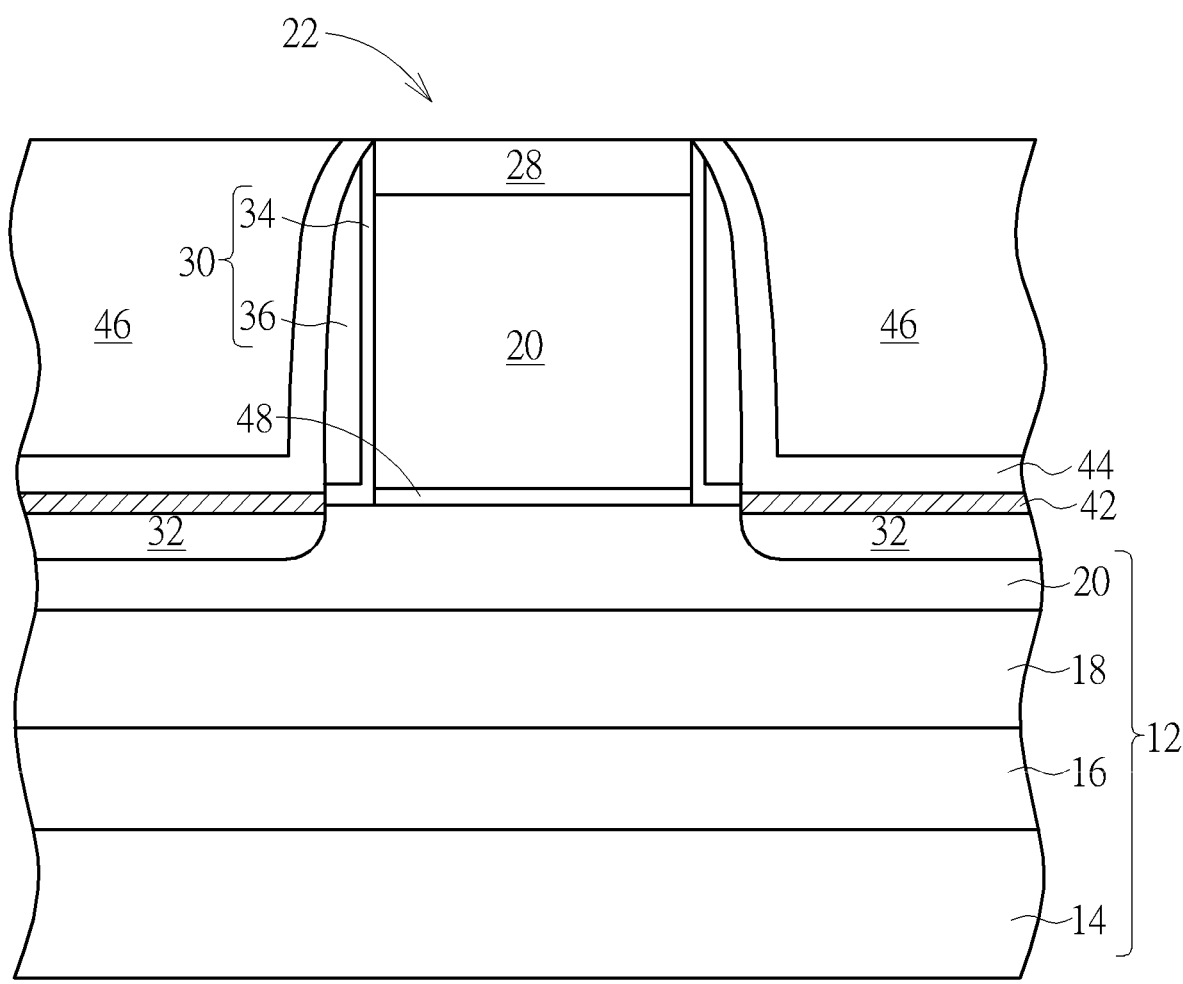

Next, as shown in FIG. 4, a contact etch stop layer (CESL) 44 is formed on the surface of the substrate 12 and the gate structure 22 and an interlayer dielectric (ILD) layer 46 is formed on the CESL 44. Next, a planarizing process such as chemical mechanical polishing (CMP) process is conducted to remove part of the ILD layer 46 and part of the CESL 44 so that the top surfaces of the hard mask 28 and the ILD layer 46 are coplanar.

Figure 5:
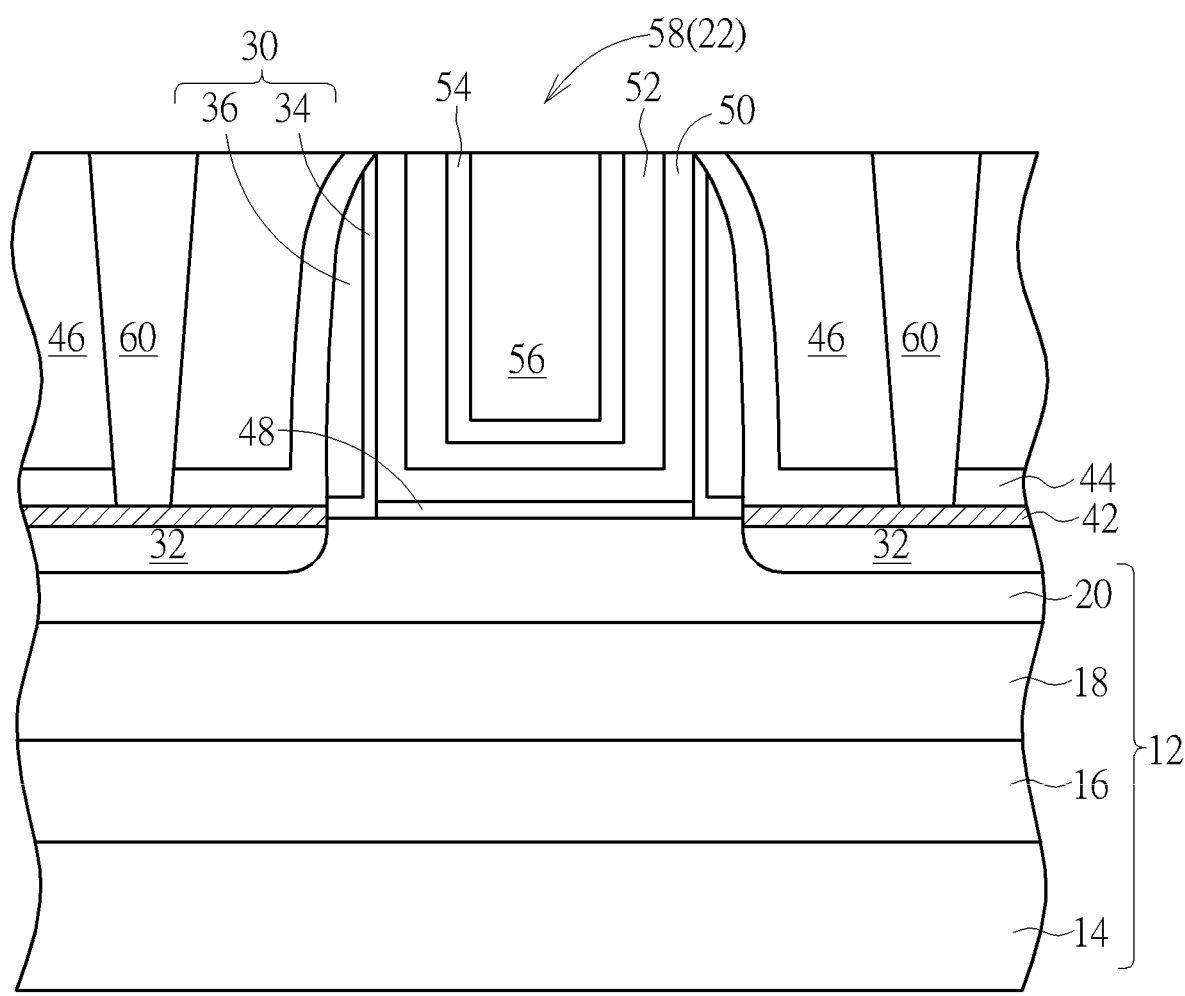

Next, as shown in FIG. 5, a replacement metal gate (RMG) process is conducted to transform the gate structure 22 into a metal gate. For instance, the RMG process could be accomplished by first performing a selective dry etching or wet etching process using etchants including but not limited to for example ammonium hydroxide ($NH_4OH$) or tetramethylammonium hydroxide (TMAH) to remove the hard mask 28, the gate material layer 2, and even the gate dielectric layer 24 of gate structure 22 for forming a recess (not shown) in the ILD layer 46. Next, a selective interfacial layer 48 or gate dielectric layer (not shown), a high-k dielectric layer 50, a work function metal layer 52, a barrier layer 54, and a low resistance metal layer 56 are formed in the recesses, and a planarizing process such as CMP is conducted to remove part of low resistance metal layer 56, part of the barrier layer 54, part of work function metal layer 52, and part of high-k dielectric layer 50 to form a metal gate 58. In this embodiment, the gate structure 22 or metal gate 58 fabricated through high-k last process of a gate last process preferably includes an interfacial layer 48 or gate dielectric layer, a U-shaped high-k dielectric layer 50, a U-shaped work function metal layer 52, a U-shaped barrier layer 54, and a low resistance metal layer 56.

In this embodiment, the high-k dielectric layer 50 is preferably selected from dielectric materials having dielectric constant (k value) larger than 4. For instance, the high-k dielectric layer 50 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 52 is formed for tuning the work function of the metal gate in accordance with the conductivity of the device. For an NMOS transistor, the work function metal layer 52 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 52 having a work function ranging between 4.8 eV and 5.2 eV may include titanium nitride (TiN), tantalum nitride (TaN), tantalum carbide (TaC), but it is not limited thereto. The barrier layer 54 formed between the work function metal layer 52 and the low resistance metal layer 56 may include titanium (Ti), titanium nitride (TiN), tantalum (Ta) or tantalum nitride (TaN). Furthermore, the material of the low-resistance metal layer 56 may include copper (Cu), aluminum (Al), titanium aluminum (TiAl), cobalt tungsten phosphide (CoWP) or any combination thereof.

Next, a photo-etching process is conducted by using a patterned mask (not shown) as mask to remove part of the ILD layer 46 and part of the CESL 44 adjacent to the metal gate 58 for forming contact holes (not shown) exposing the silicide layers 42 underneath. Next, conductive materials including a barrier layer selected from the group consisting of titanium (Ti), titanium nitride (TiN), tantalum (Ta), and tantalum nitride (TaN) and a metal layer selected from the group consisting of tungsten (W), copper (Cu), aluminum (Al), titanium aluminide (TiAl), and cobalt tungsten phosphide (CoWP) are deposited into the contact holes, and a planarizing process such as CMP is conducted to remove part of aforementioned barrier layer and low resistance metal layer for forming contact plugs 60 electrically connecting the source/drain regions 32.

As stated previously, oxygen clusters are often generated in the trap rich layer 16 of the substrate 12 during various stages of low temperature treatment processes between 350° C. to 500° C. before the formation of silicide layer or more specifically before the formation of metal layer used for forming silicides and the accumulation of these oxygen clusters ultimately increases overall resistance of the device and affects the performance of the device substantially. To resolve this issue the present invention preferably conducts a RTA process 38 between 560° C. to 700° C. after forming the source/drain regions 32 and before forming silicide layer to prevent oxygen clusters from accumulating in the trap rich layer 16.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device:
   forming a gate structure on a substrate, wherein the substrate comprises a trap rich layer having oxygen clusters;
   forming a source/drain region adjacent to the gate structure;
   performing a first cleaning process;
   performing a first rapid thermal anneal (RTA) process to remove oxygen clusters in the trap rich layer of the substrate after forming the source/drain region, wherein the first RTA process is between 560° C. to 700° C.;
   forming a metal layer on the source/drain region; and
   transforming the metal layer into a silicide layer.

2. The method of claim 1, wherein the first cleaning process comprises diluted hydrofluoric acid (dHF).

3. The method of claim 2, wherein a duration of the first cleaning process is less than 10 seconds.

4. The method of claim 1, further comprising performing a second cleaning process after performing the first RTA process.

5. The method of claim 4, wherein the second cleaning process comprises ammonia ($NH_3$) and nitrogen trifluoride ($NF_3$).

6. The method of claim 1, further comprising performing a second RTA process after forming the metal layer to transform the metal layer into the silicide layer.

7. The method of claim 1, wherein the metal layer comprises nickel-platinum alloy.

* * * * *